United States Patent
Simon et al.

(10) Patent No.: US 10,198,276 B2
(45) Date of Patent: Feb. 5, 2019

(54) CONFIGURATION OF A FREQUENCY CONVERTER, FREQUENCY CONVERTER KIT AND METHOD FOR CONFIGURING A FREQUENCY CONVERTER

(71) Applicant: Rohde & Schwarz GmbH & Co. KG, München (DE)

(72) Inventors: Hans-Joachim Simon, Wolfratshausen (DE); Marcel Ruf, Erlangen (DE)

(73) Assignee: ROHDE & SCHWARZ GHBH & CO. KG, Munich (DE)

( * ) Notice: Subject to any disclaimer, the term of this patent is extended or adjusted under 35 U.S.C. 154(b) by 145 days.

(21) Appl. No.: 14/974,846

(22) Filed: Dec. 18, 2015

(65) Prior Publication Data

US 2017/0177389 A1   Jun. 22, 2017

(51) Int. Cl.
  *G06F 9/44*    (2018.01)
  *H03K 5/00*    (2006.01)
  *G06F 9/445*   (2018.01)
  *G06F 13/10*   (2006.01)

(52) U.S. Cl.
  CPC ........ *G06F 9/44505* (2013.01); *G06F 13/102* (2013.01); *H03K 5/00006* (2013.01)

(58) Field of Classification Search
  CPC .............. G06F 9/44505; G06F 13/102; H03K 5/00006
  USPC ........................................................ 710/104
  See application file for complete search history.

(56) References Cited

U.S. PATENT DOCUMENTS

| | | | | |
|---|---|---|---|---|
| 4,703,433 A | * | 10/1987 | Sharrit | G01R 27/28 324/76.22 |
| 5,909,372 A | * | 6/1999 | Thybo | G05B 19/108 700/17 |
| 6,888,342 B2 | | 5/2005 | Bradley | |
| 7,490,209 B1 | * | 2/2009 | Charagulla | G06F 13/1668 711/167 |
| 7,761,866 B2 | * | 7/2010 | Abe | G06F 8/65 717/168 |
| 8,062,025 B2 | * | 11/2011 | Klobucar | B29C 45/2703 425/549 |
| 2002/0151993 A1 | * | 10/2002 | Olesen | H02P 23/0077 700/86 |
| 2003/0043300 A1 | * | 3/2003 | White | H04N 5/44 348/607 |
| 2004/0176923 A1 | * | 9/2004 | Shank | G01R 27/32 702/108 |
| 2005/0068211 A1 | * | 3/2005 | Arai | H03M 1/188 341/138 |
| 2005/0088166 A1 | * | 4/2005 | Shank | G01R 31/2822 324/85 |
| 2006/0043177 A1 | * | 3/2006 | Nycz | G06Q 10/087 235/385 |
| 2008/0092135 A1 | * | 4/2008 | Hindsberg | G06F 9/44521 717/174 |
| 2010/0009640 A1 | * | 1/2010 | Haban | G06F 8/60 455/77 |

(Continued)

FOREIGN PATENT DOCUMENTS

DE    10 2012 218 948 A1    6/2013

*Primary Examiner* — Christopher B Shin
(74) *Attorney, Agent, or Firm* — Shumaker & Sieffert, P.A.

(57) ABSTRACT

A non-transitory computer-readable storage medium has computer-readable data portions stored thereon, the data portions including configuration data items relating to configurable parameters of a frequency converter.

7 Claims, 1 Drawing Sheet

(56) References Cited

U.S. PATENT DOCUMENTS

2014/0327429 A1* 11/2014 Ziomek ............... G01R 27/28
324/96

* cited by examiner

CONFIGURATION OF A FREQUENCY CONVERTER, FREQUENCY CONVERTER KIT AND METHOD FOR CONFIGURING A FREQUENCY CONVERTER

FIELD OF THE INVENTION

The present invention relates to the configuration of a frequency converter, a kit with a frequency converter and a method for configuring a frequency converter. Such procedures, methods and kits may be employed in combination with a network analyzer, in particular in use for testing mobile communication devices with test signals generated by and test response signals captured by a frequency converter.

BACKGROUND OF THE INVENTION

Electronic equipment, such as mobile communication devices, is subject to various electronic tests after production. Such tests are generally necessary to ensure proper configuration, calibration and functionality of various elements of the devices under test (DUT). DUTs may be both passive and active devices. For testing purposes, specific testing devices are employed which simulate a testing environment under predefined testing conditions. For example, testing devices may employ one or more specific testing routines with predefined testing schedules. Those testing schedules regularly involve input of particular test signal sequences into the DUT and/or reception of responses to testing signals input to the DUT. Such responses may be evaluated for consistency, constancy, timeliness and other properties of an expected behavior of the DUT.

Quite often it is not possible to completely characterize all DUTs using just a single piece of test equipment. Instead, a variety of stimuli and responses are required to sufficiently measure linear and non-linear behavior of the DUT. Network analyzers (NA), such as scalar network analyzers (SNA) or vector network analyzers (VNA) are designed measure both linear and non-linear behavior of DUTs with various measurement schemes such as for example swept frequency schemes, swept power schemes, combined swept frequency and power schemes or the like.

Components or circuits passing electromagnetic signals are subject to various undesired or unavoidable influences like signal distortion, signal reflectance or frequency-dependent amplitude and phase shifts (linear influences) or intermodulation distortion (non-linear influences). One of the important testing concepts sets out to determine the reflectivity and transmission of electronic equipment with respect to high-frequency electromagnetic signals that are input to an interface port of the electronic equipment. To that end, 2-port transmission measurements are conducted to verify simulation models and measure performances of hardware prototypes in order to ensure expected behavior and accurate specifications of the equipment.

For frequency-dependent measurement and testing schemes, a combination of network analyzers with front-ended frequency converters is used to extend the frequency range of testing and test response signals into the sub-millimeter and millimeter wavelength regime. Frequency converters employ frequency multipliers to transform a RF source signal supplied at one of the ports of the network analyzer into a stimulus signal of increased frequency. Test signals and reference signals are separated using a directional coupler and both signals are down-converted into the basic frequency regime of the network analyzer using harmonic or sub-harmonic mixers.

Due to the inherent electronic characteristics of the components used in the circuitry of the frequency converters, the converters themselves are subject to non-linear output characteristics, for example a non-linear frequency dependence of the ratio of output power to input power. Typical measurement schemes, however, require linear frequency and/or power sweeps for the testing signals input to DUTs. Thus, it may be possible to determine characteristic curves of the converters and to normalize the output of the converters based on the determined curves.

Document U.S. Pat. No. 6,888,342 B2 discloses a combined handheld spectrum analyzer and vector network analyzer where an EPROM provided on a control PCB stores calibration curves of frequency dividers and amplifiers in the vector network analyzer. Document DE 10 2012 218 948 A1 discloses a computer system for pre-distorting input signals to a microwave generator on the basis of a system model.

It would, however, be desirable to find solutions for configuring frequency converters in testing environments that offer more flexibility and do not require separating configuration measurements to be undertaken at the testing site.

SUMMARY OF THE INVENTION

According to the disclosure of present invention computer-readable storage media, frequency converter kits, frequency converters, network analyzer kits, uses of computer-readable storage media and methods for configuring frequency converters, specifically frequency converters for use in testing electronic equipment, may be implemented.

Particularly, according to a first aspect of the invention, a non-transitory computer-readable storage medium comprises computer-readable data portions, the computer-readable data portions comprising configuration data items relating to configurable parameters of a frequency converter.

According to a second aspect of the invention, a frequency converter kit comprises a frequency converter having a data input/output interface, and a non-transitory computer-readable storage medium comprising computer-readable data portions, the data portions comprising configuration data items relating to configurable parameters of the frequency converter. The non-transitory computer-readable storage medium is configured to be coupled to the data input/output interfaced for transmitting the configuration data items to the frequency converter.

According to a third aspect of the invention, a frequency converter comprises a microprocessor embedded in the frequency converter, and a data storage medium embedded in the frequency converter and coupled to the microprocessor, the data storage medium comprising computer-readable data portions, the data portions comprising configuration data items relating to configurable parameters of the frequency converter The microprocessor is configured to retrieve the computer-readable data portions from the data storage medium and to configure components of the frequency converter based on the configuration data items contained in the retrieved computer-readable data portions.

According to a fourth aspect of the invention, a network analyzer kit comprises a network analyzer, a frequency converter having a data input/output interface and configured to receive an RF input signal with a first RF frequency from the network analyzer and to generate an RF testing signal with a second RF frequency on the basis of the RF input signal, the second RF frequency being an integer multiple of the first RF frequency, and a non-transitory computer-readable storage medium comprising computer-readable data portions, the data portions comprising configuration data items relating to configurable parameters of the frequency converter. The non-transitory computer-readable storage medium is configured to be coupled to the data input/output interfaced for transmitting the configuration data items to the frequency converter.

According to a fifth aspect of the invention, a method for configuring a frequency converter comprises coupling a non-transitory computer-readable storage medium comprising computer-readable data portions, the data portions comprising configuration data items relating to configurable parameters of the frequency converter, to a data input/output interface of the frequency converter, transmitting configuration data items of the non-transitory computer-readable storage medium to the frequency converter via the data input/output interface of the frequency converter, and configuring settings of components of the frequency converter based on the transmitted configuration data items.

According to a sixth aspect of the invention, a computer-readable storage medium comprising computer-readable data portions, the computer-readable data portions comprising configuration data items relating to configurable parameters of a frequency converter, is used for configuring settings of a frequency converter.

According to a seventh aspect of the invention, a signal generation system comprises a frequency converter having a data input/output interface, a signal generator coupled to the frequency converter and configured to input baseband test signals to the frequency converter, and a non-transitory computer-readable storage medium comprising computer-readable data portions, the data portions comprising configuration data items relating to configurable parameters of the frequency converter. The non-transitory computer-readable storage medium is configured to be coupled to the data input/output interfaced for transmitting the configuration data items to the frequency converter.

One of the ideas underlying the present invention is to deliver frequency converters along with separate configuration settings that have been individually generated before delivery of the frequency converter. At the location of use, the frequency converter may then be configured using the separately delivered configuration settings.

Amongst others, there are several specific advantages associated with such computer-readable storage media, frequency converter kits, frequency converters, network analyzer kits and their concomitant configuration methods and use for configuring frequency converters. First of all, obtaining configuration settings for the particular frequency converter is facilitated since the generation of the configuration settings does not necessarily need to be performed at the location of use of the frequency converter. Due to some configuration parameters being dependent on measurements with complex and potentially expensive equipment, such as thermal power sensors, a determination of configuration settings at the location of use may be cumbersome and time-consuming. With pre-determined and readily available configuration parameters that have been obtained and measure before delivery, e.g. at a manufacturing site of the frequency converter, the configuration of the converter may be faster, less prone to errors and does not require specific measurement equipment.

Second, the configuration settings of the frequency converter may be easily updated in subsequent configuration steps. This may be useful, if the configuration settings have been updated or adapted to specific applications of the converter. With the separate delivery of the storage media containing updated configuration settings, it may not be necessary to deliver a new frequency converter or for the user to send in the frequency converter for maintenance to the manufacturer, but instead a further storage medium containing the updated configuration settings may be shipped to the user. This saves time and shipping costs and does not require the frequency converter to be physically removed from its location of use, for example a testing facility.

Additionally, the configuration settings for one frequency converter may in some occasions be used for the configuration of further frequency converters. Furthermore, the configuration settings of different frequency converters may be adapted and attuned to one another, specifically when multiple frequency converters are to be employed in a common testing environment. For example, in conventional 2-port measurements, two different frequency converters are coupled to a device under test at different ports of the device under test in order to measure both transmission and reflectance parameters at the same time. Configuration settings for those interrelated frequency converters in 2-port measurement testing environments may be matched more easily and more closely when separate storage media comprising configuration parameters are used.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the accompanying drawings. Elements in the drawings are illustrated for simplicity and clarity and have not necessarily been drawn to scale.

In all figures of the drawings elements, features and components which are the same or at least have the same functionality have been provided with the same reference symbols, unless explicitly stated otherwise.

DETAILED DESCRIPTION OF THE EMBODIMENTS

Network analyzers and frequency converters as disclosed herein may specifically be used for testing electronic equipment which is operated in an environment sensitive to radio frequency (RF) signals. Such equipment may be used to output, receive, measure or otherwise process RF-sensitive parameters and signals. Those tests are conventionally performed using standardized testing routines conducted by specifically designed testing equipment involving network analyzers and frequency converters that are connected to a DUT. For example, the electronic equipment that may be tested may comprise mobile communication devices, i.e. any mobile electronic equipment capable of wirelessly communicating via a mobile communication network. Mobile communication devices may include laptops, notebooks, tablets, smartphones, mobile phones, pagers, PDAs, digital still cameras, digital video cameras, portable media players, gaming consoles, virtual reality glasses, mobile PCs, mobile modems, machine-to-machine (M2M) devices and similar electronic equipment.

Figure 1:
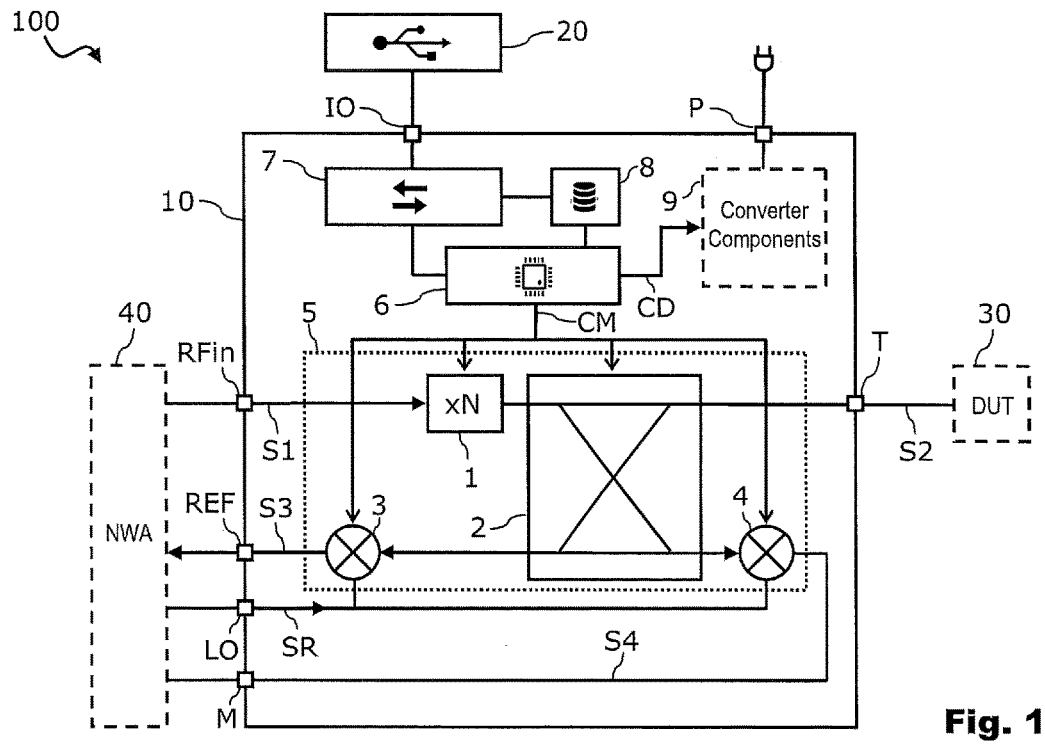
FIG. 1 schematically illustrates a testing environment of a frequency converter according to some embodiments of the invention.

FIG. 1 schematically illustrates a testing environment 100 including a frequency converter 10. The frequency converter 10 may be part of a network analyzer kit having a network analyzer 40 and a frequency converter 10. The network analyzer 40 and frequency converter 10 of the network analyzer kit may be used for testing electronic equipment, such as a device under test (DUT) generally indicated with the reference numeral 30. The DUT 30 may be connected to the frequency converter 10 for testing purposes, and the network analyzer 40 and the frequency converter 10 may act together in implementing and performing testing routines according to pre-defined testing schedules in order to subject the DUT 30 to desired tests. The tests may involve inputting predefined sequences of testing signals to the DUT 30 and receiving and evaluating testing response signals or series of testing response signals from the DUT 30 correlating or being associated with the sequences of testing signals.

The frequency converter 10 may comprise a frequency multiplier 1, a directional coupler 2, a first down-conversion mixer 3 and a second down-conversion mixer 4. The frequency multiplier 1, the directional coupler 2, the first down-conversion mixer 3 and the second down-conversion mixer 4 may be part of a dedicated reflectometer module 5. The first and second down-conversion mixers 3 and 4 may for example be harmonic or sub-harmonic mixers.

The frequency multiplier 1 is coupled with the directional coupler 2 and is configured to multiply the frequency of a baseband testing signal S1 as received at a testing signal input RFin of the frequency converter 10. The frequency multiplied baseband testing signal is relayed to the directional coupler 2. Part of the frequency multiplied baseband testing signal is fed back to the first down-conversion mixer 3 that is coupled to the directional coupler 2. The first down-conversion mixer 3 is coupled to a reference signal output REF of the frequency converter 10 as is configured to downmix the frequency multiplied baseband testing signal back to a baseband reference signal S3 again. To that end, the first down-conversion mixer 3 is fed by a local oscillator signal SR received at a local oscillator input LO of the frequency converter 10.

The frequency multiplied baseband testing signal is further fed as testing signal S2 to a DUT 30 coupled to the frequency converter 10 at a testing interface port T. The testing interface port T may for example comprise a waveguide port. Testing response signals received from the DUT 30 in response to frequency multiplied baseband testing signals fed to the DUT 30 may be relayed to the directional coupler which is connected to the second down-conversion mixer 4 that is fed with the local oscillator signal SR received at the local oscillator input LO of the frequency converter 10 as well. The output signal of the second down-conversion mixer 4 is a baseband measurement signal S4 which is fed to a measurement signal interface M of the frequency converter 10.

All of the interfaces RFin, REF, LO and M may be connected to corresponding interface ports of a network analyzer (NWA) 40 in the testing environment 100. The network analyzer 40 may for example be a vector network analyzer or a scalar network analyzer. The baseband testing signals S1 and the local oscillator signal SR may be generated by the network analyzer 40 depending on a predetermined testing routine for testing the DUT 30. The reference baseband signal S3 as well as the measurement signal S4 may be received by the network analyzer 40 for normalizing and evaluating the testing results.

The frequency converter 10 may further comprise an embedded non-volatile memory 8, an embedded interface controller 7 and a general-purpose processor 6 coupled to both the non-volatile memory 8 and the interface controller 7. The interface controller 7 may be coupled to a data input/output interface IO of the frequency converter 10 and may be configured to transmit and receive data items from external data storage devices, such as a computer-readable storage medium 20 as exemplarily illustrated in FIG. 1. The computer-readable storage medium 20 may for example comprise a USB flash drive, a memory card, an optical storage device, a magnetic data storage tape, a zip disk, an external hard disk drive, a Microdrive® and a floppy disk.

The general-purpose processor 6 may be a central processing unit, an ASIC, a FPGA or any similar programmable logic device. The general-purpose processor 6 may run an operation system specifically used for operating the frequency converter 10. The general-purpose processor 6 may in particular be configured to access one or more components of the dedicated reflectometer module 5 for configuration purposes. The general-purpose processor 6 may be configured to configure parameters of components of the reflectometer module 5 on the basis of configuration parameters as stored in computer-readable data portions on the non-volatile memory 8 of the external storage medium 20 as data storage medium. The data portions comprise configuration data items which relate to configurable parameters of the frequency converter 10, particularly to configurable parameters CM of the reflectometer module 5. For example, the configurable parameters CM may comprise one or more of pass filter range settings of filters of the frequency converter 10, voltage controlled oscillator (VCO) voltage settings, pre-distortion parameters, and phase detector settings of the frequency multiplier 1, settings of the mixers 3 and 4, or power flatness correction parameters and output power linearization parameters of the reflectometer module 5.

The frequency converter 10 may further comprise additional converter components 9, such as—amongst others— cooling fans, a power supply unit (PSU) and a temperature controller. For example, the PSU may be connected to a power supply interface P of the frequency converter 10 for supplying the reflectometer module 5, the processor 6, the embedded interface controller 7 and the memory 8 with power. The general-purpose processor 6 may further be configured to configure other parameters CD than the parameters CM pertaining to the operation of the reflectometer module 5. Those parameters CD may for example comprise one or more of fan speed settings, supply voltage settings, temperature settings, input power settings and output power settings of the corresponding converter components 9.

Figure 2:
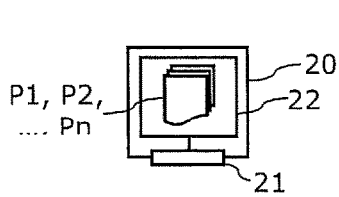
FIG. 2 schematically illustrates a non-transitory computer-readable storage medium according to another embodiment of the invention.

FIG. 2 schematically illustrates a non-transitory computer readable storage medium 20 having a non-volatile memory component 22 and an interface component 21 coupled to the memory component 21. The computer readable storage medium 20 may store data portions on the non-volatile memory component 22 relating to a plurality of configurable parameters and parameter sets P1, P2, . . . , Pn. Those configurable parameters and parameter sets P1, P2, . . . , Pn may be any combination of file and data structures in a suitable data format which enables the general-purpose processor 6 of a frequency converter, such as the frequency converter 10 of FIG. 1, to extract configuration data items appropriately formatted to alter or update settings of components in the frequency converter.

Figure 3:
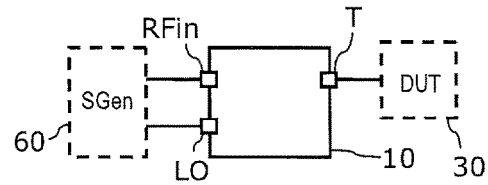
FIG. 3 schematically illustrates a signal generation system according to yet another embodiment of the invention.

FIG. 3 schematically illustrates a signal generation system including a frequency converter 10. Instead of a network analyzer, the frequency converter 10 in the signal generation system of FIG. 3 may be connected to a signal generator 60. The signal generator 60 and frequency converter 10 of the signal generation system may be used for testing electronic equipment, such as a device under test (DUT) generally indicated with the reference numeral 30 and connected to the frequency converter 10 at a testing port T.

The signal generator 60 generates testing signals in baseband to be input to the frequency converter at the input interface RFin. The baseband testing signals are then up-converted by the frequency converter, for example to a millimeter or sub-millimeter wavelength regime. The signal generator 60 may further be configured to generate a local oscillator signal to be input at the frequency converter 10 at a local oscillator input interface LO. The local oscillator signal of the signal generator 60 may be used as mixing input signal for harmonic and sub-harmonic mixers of the frequency converter 10.

The frequency converter 10 of the signal generation system in FIG. 3 may be similarly configured using a storage medium 20 as exemplarily illustrated in conjunction with FIG. 2. Additionally or alternatively, the frequency converter 10 may comprise embedded storage memory elements such as the memory 8 of FIG. 1 in order to configure settings of the frequency converter 10.

Figure 4:
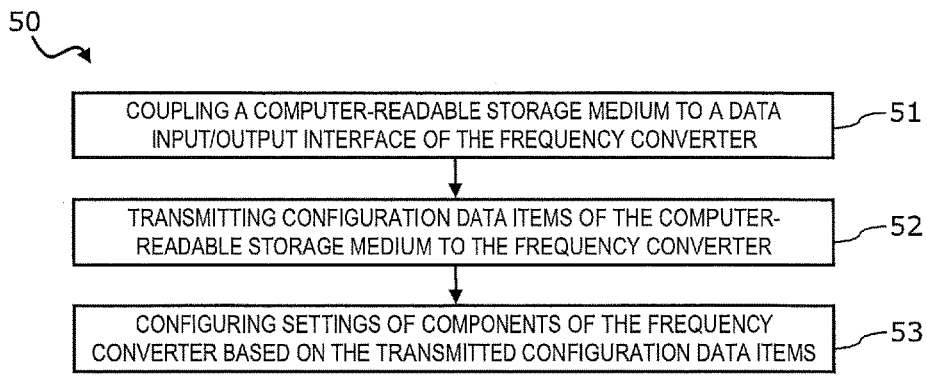
FIG. 4 schematically illustrates a method for configuring a frequency converter according to a further embodiment of the invention.

FIG. 4 schematically illustrates procedural stages of a method 50 for configuring a frequency converter, for example a frequency converter 10 as exemplarily illustrated in and explained in conjunction with FIG. 1. The method 50 may make use of a non-transitory computer readable storage medium, such as the storage medium 20 as exemplarily illustrated in and explained in conjunction with FIG. 2. The configuration method 50 may advantageously be used prior to testing devices under test (DUTs) with a frequency converter and a network analyzer, and may be performed at the location of use of the frequency converter. The configuration method 50 may advantageously also be used prior to testing devices under test (DUTs) with a frequency converter and a signal generator in signal generation system as shown in an explained in conjunction with FIG. 3.

In the testing method 50, a first step 51 includes coupling a non-transitory computer-readable storage medium 20 comprising computer-readable data portions to a data input/output interface IO of a frequency converter 10. The data portions may comprise configuration data items relating to configurable parameters of the frequency converter 10. The configurable parameters may for example comprise one or more parameters of the group of pass filter range settings, voltage controlled oscillator (VCO) voltage settings, pre-distortion parameters, phase detector settings, up-conversion mixer settings, down-conversion mixer settings, fan speed settings, supply voltage settings, temperature settings, input power settings, output power settings, power flatness correction parameters and output power linearization parameters of the frequency converter 10.

In a second step 52, the configuration data items are transmitted from the non-transitory computer-readable storage medium 20 to the frequency converter 10 via the data input/output interface IO. This transmission may be facilitated by a microprocessor 6 of the frequency converter 10 that is configured to access the storage medium 20 via a data transmission adapter 7 that is coupled between the microprocessor 6 and the data input/output interface IO. The data input/output interface IO may for example be a USB interface, a FireWire interface, a SATA interface, a Serial Attached SCSI interface, a PCIe interface, a Thunderbolt interface or an Ethernet interface.

Finally, in a third step 53, settings of components of the frequency converter 10 are configured based on the transmitted configuration data items. The configuration may in particular be performed at the location of use of the frequency converter 10, such as a testing laboratory for DUTs 30, on the basis of configuration data items that have been pre-installed on the storage medium 20 prior to delivery of the frequency converter 10 to the location of use.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections between various elements as shown and described with respect to the drawings may be a type of connection suitable to transfer signals from or to the respective nodes, units or devices, for example via intermediate devices. Accordingly, unless implied or stated otherwise the connections may for example be direct connections or indirect connections.

Because the apparatuses implementing the present invention are, for the most part, composed of electronic components and circuits known to those skilled in the art, details of the circuitry and its components will not be explained in any greater extent than that considered necessary as illustrated above, for the understanding and appreciation of the underlying concepts of the present invention and in order not to obfuscate or distract from the teachings of the present invention.

Also, the invention is not limited to physical devices or units implemented in non-programmable hardware, but can also be applied in programmable devices or units able to perform the desired device functions by operating in accordance with suitable program code. Furthermore, the devices may be physically distributed over a number of apparatuses, while functionally operating as a single device. Devices functionally forming separate devices may be integrated in a single physical device. Those skilled in the art will recognize that the boundaries between logic or functional blocks are merely illustrative and that alternative embodiments may merge logic or functional blocks or impose an alternate decomposition of functionality upon various logic or functional blocks.

In the description, any reference signs shall not be construed as limiting the claim. The word "comprising" does not exclude the presence of other elements or steps then those listed in a claim. Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage. The order of method steps as presented in a claim does not prejudice the order in which the steps may actually be carried, unless specifically recited in the claim.

Skilled artisans will appreciate that the illustrations of chosen elements in the drawings are only used to help to improve the understanding of the functionality and the arrangements of these elements in various embodiments of the present invention. Also, common and well understood elements that are useful or necessary in a commercially feasible embodiment are generally not depicted in the drawings in order to facilitate the understanding of the technical concept of these various embodiments of the present invention. It will further be appreciated that certain procedural stages in the described methods may be described or depicted in a particular order of occurrence while those skilled in the art will understand that such specificity with respect to sequence is not actually required.

What is claimed is:

1. A frequency converter kit, comprising:
a first frequency converter having a first data input/output interface and a first dedicated reflectometer module with a first frequency multiplier, a first directional coupler, a first down-conversion mixer, and a second down-conversion mixer;
a second frequency converter having a second data input/output interface and a second dedicated reflectometer module with a second frequency multiplier, a second directional coupler, a third down-conversion mixer, and a fourth down-conversion mixer; and
a non-transitory computer-readable storage medium comprising computer-readable data portions, the data portions comprising configuration data items relating to configurable parameters of components of the first frequency converter,
wherein the non-transitory computer-readable storage medium is configured to be coupled to the second data input/output interface for transmitting the configuration data items to the second frequency converter,
the configurable parameters comprising power flatness correction parameters or output power linearization parameters of the first dedicated reflectometer module,
wherein the power flatness correction parameters or output power linearization parameters set a power flatness correction or output power linearization of the first dedicated reflectometer module, and
wherein a power flatness correction or output power linearization of the second dedicated reflectometer module is set to be same as the power flatness correction or output power linearization of the first dedicated reflectometer module based on the transmitting of the configuration data items to the second frequency converter.

2. The frequency converter kit of claim 1, wherein the non-transitory computer-readable storage medium comprises one of a USB flash drive, a memory card, an optical storage device, a magnetic data storage tape, a zip disk, an external hard disk drive, a Microdrive® and a floppy disk, and wherein the data input/output interface of the frequency converter includes one of a USB interface, a FireWire interface, a SATA interface, a Serial Attached SCSI interface, a PCIe interface, a Thunderbolt interface and an Ethernet interface.

3. A frequency converter comprising:
a dedicated reflectometer module with a frequency multiplier, a directional coupler, a first down-conversion mixer, and a second down-conversion mixer;
a microprocessor embedded in the frequency converter;
a data input/output interface coupled to the microprocessor; and
a data storage medium embedded in the frequency converter and coupled to the microprocessor, the data storage medium comprising computer-readable data portions, the data portions comprising configuration data items relating to configurable parameters of a further frequency converter,
wherein the microprocessor is configured to retrieve the computer-readable data portions from the data storage medium and to configure components of the frequency converter based on the configuration data items contained in the retrieved computer-readable data portions,
wherein the microprocessor is further configured to receive configuration data items relating to configurable parameters of the further frequency converter via the data input/output interface and to store the received configuration data items as the computer-readable data portions on the data storage medium,
the configurable parameters comprising power flatness correction parameters or output power linearization parameters of a dedicated reflectometer module of the further frequency converter,
wherein the power flatness correction parameters or output power linearization parameters set a power flatness correction or output power linearization of the dedicated reflectometer module of the frequency converter to be same as a power flatness correction or output power linearization of the dedicated reflectometer module of the further frequency converter based on receiving the configuration data items relating to the configurable parameters of the further frequency converter.

4. A system, comprising:
a network analyzer;
a first frequency converter having a first data input/output interface and a first dedicated reflectometer module with a frequency multiplier, a directional coupler, a first down-conversion mixer, and a second down-conversion mixer, the first frequency converter being configured to receive an RF input signal with a first RF frequency from the network analyzer and to generate and output an RF testing signal with a second RF frequency on the basis of the RF input signal, the second RF frequency being an integer multiple of the first RF frequency;
a second frequency converter having a second data input/output interface and a second dedicated reflectometer module with a frequency multiplier, a directional coupler, a third down-conversion mixer, and a fourth down-conversion mixer, the second frequency converter being configured to receive an RF input signal with a third RF frequency from the network analyzer and to generate and output an RF testing signal with a fourth RF frequency on the basis of the RF input signal, the fourth RF frequency being an integer multiple of the third RF frequency; and
a non-transitory computer-readable storage medium comprising computer-readable data portions, the data portions comprising configuration data items relating to configurable parameters of components of the second frequency converter, wherein the non-transitory computer-readable storage medium is configured to be coupled to the first data input/output interface for transmitting the configuration data items to the first frequency converter, the configurable parameters comprising power flatness correction parameters or output power linearization parameters of the second dedicated reflectometer module, wherein the power flatness correction parameters or output power linearization parameters set a power flatness correction or output power linearization of the second dedicated reflectometer module, and wherein a power flatness correction or output power linearization of the first dedicated reflectometer module is set to be same as the power flatness correction or output power linearization of the second dedicated reflectometer module based on the transmitting of the configuration data items to the first frequency converter.

5. A signal generation system, comprising:

a first frequency converter having a first data input/output interface and a first dedicated reflectometer module with a first frequency multiplier, a first directional coupler, a first down-conversion mixer, and a second down-conversion mixer;

a second frequency converter having a second data input/output interface and a second dedicated reflectometer module with a second frequency multiplier, a second directional coupler, a third down-conversion mixed and a fourth down-conversion mixer;

a signal generator coupled to the second frequency converter and configured to input baseband test signals to the second frequency converter; and a non-transitory computer-readable storage medium comprising computer-readable data portions, the data portions comprising configuration data items relating to configurable parameters of components of the second frequency converter, wherein the non-transitory computer-readable storage medium is configured to be coupled to the first data input/output interface for transmitting the configuration data items to the first frequency converter, the configurable parameters comprising power flatness correction parameters or output power linearization parameters of the second dedicated reflectometer module, wherein the power flatness correction parameters or output power linearization parameters set a power flatness correction or output power linearization of the second dedicated reflectometer module, and wherein a power flatness correction or output power linearization of the first dedicated reflectometer module is set to be same as the power flatness correction or output power linearization of the second dedicated reflectometer module based on the transmitting of the configuration data items to the first frequency converter.

6. The signal generation system of claim 5, wherein the non-transitory computer-readable storage medium comprises one of a USB flash drive, a memory card, an optical storage device, a magnetic data storage tape, a zip disk, an external hard disk drive, a Microdrive® and a floppy disk, and wherein the data input/output interface of the frequency converter includes one of a USB interface, a FireWire interface, a SATA interface, a Serial Attached SCSI interface, a PCIe interface, a Thunderbolt interface and an Ethernet interface.

7. A method for configuring a first frequency converter, the method comprising:

coupling a non-transitory computer-readable storage medium comprising computer-readable data portions, the data portions comprising configuration data items relating to power flatness correction parameters or output power linearization parameters of a second dedicated reflectometer module of a second frequency converter, to a data input/output interface of the first frequency converter, the first frequency converter having a first dedicated reflectometer module with a frequency multiplier, a directional coupler, a first down-conversion mixer, and a second down-conversion mixer;

transmitting configuration data items of the non-transitory computer-readable storage medium to the first frequency converter via the data input/output interface of the first frequency converter; and configuring settings of the first dedicated reflectometer module of the first frequency converter based on the transmitted configuration data items, wherein the power flatness correction parameters or output power linearization parameters set a power flatness correction or output power linearization of the second dedicated reflectometer module, and wherein a power flatness correction or output power linearization of the first dedicated reflectometer module is set to be same as the power flatness correction or output power linearization of the second dedicated reflectometer module based on the transmitting of the configuration data items to the first frequency converter.

* * * * *